(12) United States Patent
Wern et al.

(10) Patent No.: US 8,049,518 B2
(45) Date of Patent: Nov. 1, 2011

(54) CAPACITIVE SENSOR SYSTEM

(75) Inventors: Lars-Ake Wern, Stockholm (SE); Jan Johansson, Bromma (SE)

(73) Assignee: Electrolux Home Products Corporation N.V., Zaventem (BE)

( * ) Notice: Subject to any disclaimer, the term of this patent is extended or adjusted under 35 U.S.C. 154(b) by 106 days.

(21) Appl. No.: 11/575,327

(22) PCT Filed: Sep. 13, 2005

(86) PCT No.: PCT/SE2005/001325

§ 371 (c)(1),
(2), (4) Date: Dec. 11, 2007

(87) PCT Pub. No.: WO2006/031185

PCT Pub. Date: Mar. 23, 2006

(65) Prior Publication Data

US 2008/0204047 A1     Aug. 28, 2008

(30) Foreign Application Priority Data

Sep. 17, 2004  (SE) ...................................... 0402261

(51) Int. Cl.
   G01R 27/26    (2006.01)
   H03K 17/96    (2006.01)
(52) U.S. Cl. .......................... 324/661; 324/660; 327/517
(58) Field of Classification Search .................. 324/600, 324/658–690; 327/517; 62/125
   See application file for complete search history.

(56) References Cited

U.S. PATENT DOCUMENTS

| 4,453,112 | A | | 6/1984 | Sauer et al. |
|---|---|---|---|---|
| 4,691,195 | A | * | 9/1987 | Sigelman et al. .......... 340/545.4 |
| 5,621,290 | A | | 4/1997 | Heller et al. |
| 5,730,165 | A | * | 3/1998 | Philipp ............................. 137/1 |
| 5,802,479 | A | * | 9/1998 | Kithil et al. ..................... 701/45 |
| 6,160,370 | A | | 12/2000 | Ohnuma |
| 6,348,862 | B1 | * | 2/2002 | McDonnell et al. .......... 340/562 |
| 6,377,009 | B1 | | 4/2002 | Philipp |
| 6,724,324 | B1 | | 4/2004 | Lambert |
| 2003/0085679 | A1 | * | 5/2003 | Bledin et al. .................. 318/264 |

FOREIGN PATENT DOCUMENTS

| GB | 2243217 A | | 10/1991 |
|---|---|---|---|
| JP | 3-500598 | | 2/1991 |
| JP | 2000-180032 A | | 6/2000 |
| JP | 2003-166369 A | | 6/2003 |
| WO | 89/08952 A1 | | 9/1989 |
| WO | WO8908952 | * | 9/1989 |
| WO | 02/089328 A1 | | 11/2002 |
| WO | 03/069104 A1 | | 8/2003 |
| WO | 2004/031520 A1 | | 4/2004 |

OTHER PUBLICATIONS

International Search Report, PCT/SE2005/001325, Dec. 9, 2005.
Japanese Office action for 2007-532284, dated Apr. 5, 2011.
International Search Report for PCT/SE2007/000258 dated Jun. 14, 2007.

* cited by examiner

*Primary Examiner* — Melissa Koval
*Assistant Examiner* — Farhana Hoque
(74) *Attorney, Agent, or Firm* — Pearne & Gordon LLP

(57) ABSTRACT

The present invention relates to a capacitive sensor system provided for a moving object 21.The system comprises an antenna device with a first 26 and a second portion 39 which are movable in relation to each other, the two portions 26,39 being connected in parallel for capacitive influence from the surroundings. The first portion 26 constitutes in an electrical conductive part of said moving object 21 and the second section 39 constitutes in an electrical conductive device arranged at a rest position for the moving object 21.

5 Claims, 7 Drawing Sheets

CAPACITIVE SENSOR SYSTEM

BACKGROUND

Capacitive sensor systems are well known for their capability of providing control and operation of different appliances based on the presence of a human body. Such systems in general are for instance described in U.S. Pat. No. 4,453,112 and U.S. Pat. No. 5,621,290. In these documents a sensor electrode is arranged on the window frame of a car window. As soon as a portion of a human body, such as a hand, approaches the sensor electrode, the capacitance between the sensor electrode and an earth electrode increases. This increase in capacitance changes the frequency of an output signal of the electrode, which is compared to a reference, and a motor moving the window operates based on this change. The sensor system can respond to semi-conductive elements such as a human body, but plastics and wood will not cause any effect.

Another system providing a capacitive sensor capability is disclosed in document WO02089328 in which the sensor circuit is connected to a load line providing power to an electrical device, such as an electrical motor. This system provides the benefit that the load line instead of influencing the sensor system and causing a decrease in sensor capability near that line, instead will support the system by operating as an antenna part of the sensor system.

It is sometimes interesting to arrange the antenna of the capacitive sensor system on the part which is moving, such as a door, lid or window as described above. Such a system is for instance disclosed in the document WO03069104, in which the capacitive sensor antenna is positioned to avoid that the automatic elevator door pinches a person. When someone puts his hand near the antenna the door will be stopped to prevent accidents to happen.

One problem with this last mentioned system and other similar systems with an antenna positioned on the moving part is that when the door or the like moves towards a closing position the metal frame which is normally a part of the construction holding the door will interfere with the system. The reason for this is that the door frame is a part of the earth plane that in said system forms a first electrode of the capacitance of said sensor. The antenna positioned on the door forms the second electrode. The system will therefore not be able to detect a human body part positioned at the frame. When the door is closing, the system will sense the increase in the capacitance value caused by the approaching door frame. However, to avoid that this influences the system, a default set will normally make sure that this change will not cause the door to be stopped.

Such a default set will result in that a human body part, especially a smaller one, will not be detected by the system. The frame will make the system blind since its major influence on the capacitance is much larger that the smaller influence on the capacitance caused by the body part.

SUMMARY OF THE PRESENT INVENTION

It is therefore an object of the present invention to provide a capacitive sensor system, applied on a door or lid held by a capacitance influenced frame, which is able to detect a small portion of a human body. This object is achieved according to the invention as defined in the characterizing portion of claim 1.

DESCRIPTION OF THE DRAWINGS

The invention will now be described further with reference to the accompanying drawings, in which.

DESCRIPTION OF ILLUSTRATIVE EMBODIMENTS

Figure 1:
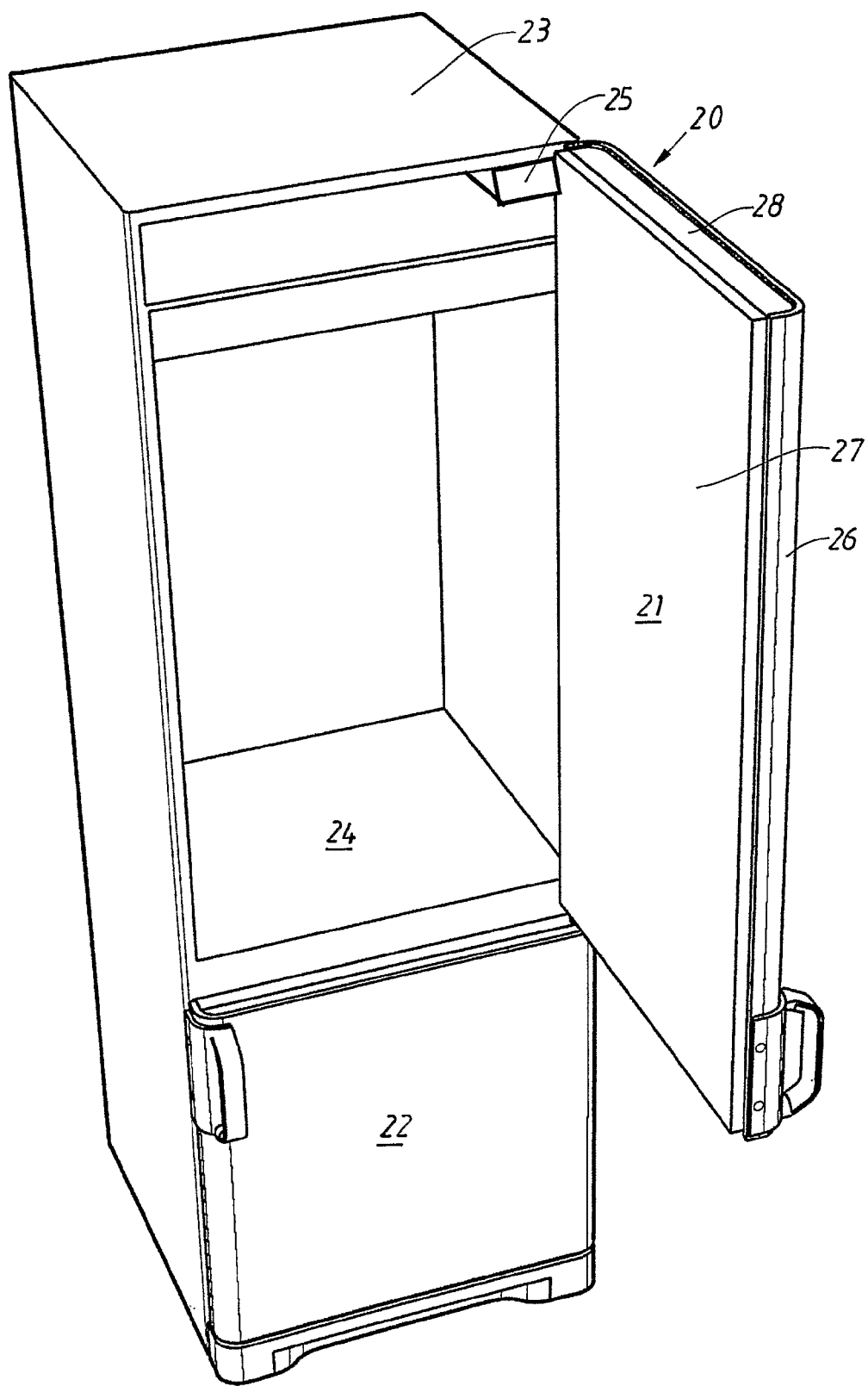
FIG. 1 shows a front perspective view of a cooling cabinet in which a capacitive sensor system of the prior art type could be implemented.

The figures show illustrative embodiments of a capacitive sensor system in accordance with the invention. The illustrative embodiments shall not be interpreted as a limitation of the invention. Its purpose is to illustrate how the invention can be applied and to further illustrate the scope of the invention.

The illustrative embodiments relates to a capacitive sensor system in a cooling cabinet. In these embodiments the cabinet itself, and the properties of said cabinet, are used to create a sensor system for at partly control the movement of a cabinet door. In FIGS. 1-4 the basic principle of using the cabinet as part of the sensor system is illustrated while FIGS. 5-9 shows illustrative embodiments in accordance with the present invention In FIG. 1 a cooling cabinet 20 is shown. The cabinet comprises one upper 21 door and one lower 22 door, each one enclosing a cooled compartment. The figure is only schematic and the open upper compartment does not contain any shelves or the like. The cabinet body comprises an outer metal liner 23 forming the shape of the cabinet and also an inner liner 24 forming said upper compartment. The door 21 swings on hinges (not shown) and is electrically isolated from the body. A motor unit 25 is shown schematically, illustrating the fact the door can be moved between open and closed position automatically by the operation of the motor unit.

The invention is based on the insight that a cooling cabinet is well suited for being provided with capacitive sensor system, thereby that it is common that the door is in metal and is electrically insulated from the cabinet body. The hinge (either made in plastics or metal) is attached to the upper and lower end cap of the door. These and caps are made in plastics and thereby make sure that no electrical connection is established between the metal door and the metal cabinet body.

Furthermore, the cabinet 20 comprises an electrically operable unit 25 that allows rotation of the door. The electrically operable unit could for instance be an electromechanical unit such as an electrical motor or solenoid, and has a suitable voltage level, for instance 12 or 24 Volts DC. The operable unit could also comprise magnets being positioned in the door and in the body respectively. For instance at least one of them is an electromagnet being powered by the system. In case a motor is used it preferably comprises a gear to transform the rotation of the motor into a force which is enough to move the door. The motor properties, the voltage level and the gear design are all adapted to provide the smoothest door movement possible. The smooth movement is of great importance since the user has to feel that the system is reliable and easy to use. The capacitive sensor system that is connected to the electrically operable unit will also comprise control means in order to achieve said smooth movement.

Figure 2:
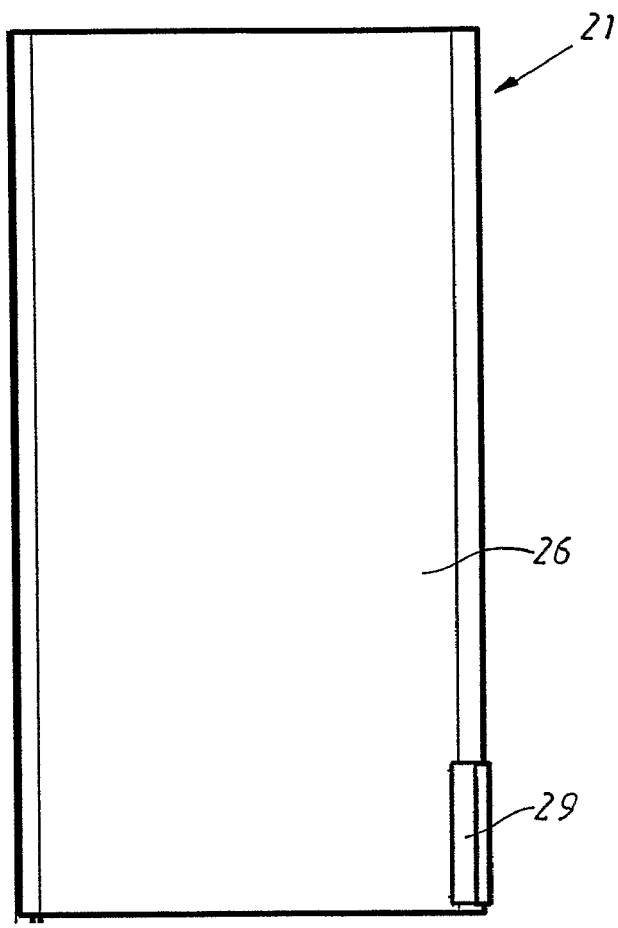
FIG. 2 shows a front view of the upper door or the cabinet according to FIG. 1.
Figure 3:
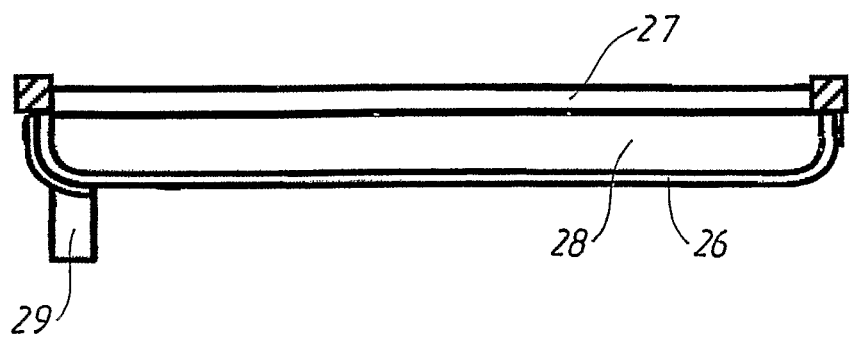
FIG. 3 shows a top view of the door according to FIG. 2.

FIGS. 2 and 3 shows the upper door 21 in a front view and a top view. The door comprises a metal outer liner 26 forming the design of the door. The outer liner together with the inner liner 27, see also FIGS. 1 and 2, encloses a space in which heat insulating material is arranged. In its end sections, the end caps 28 are positioned also contributing to enclose said space. As early mentioned these end caps also hold the hinges holding the door in pivoting position. A door handle 29 is shown in both views. The metal outer liner of the door will, as shown later, create an important, part of the capacitive sensor system.

Figure 4:
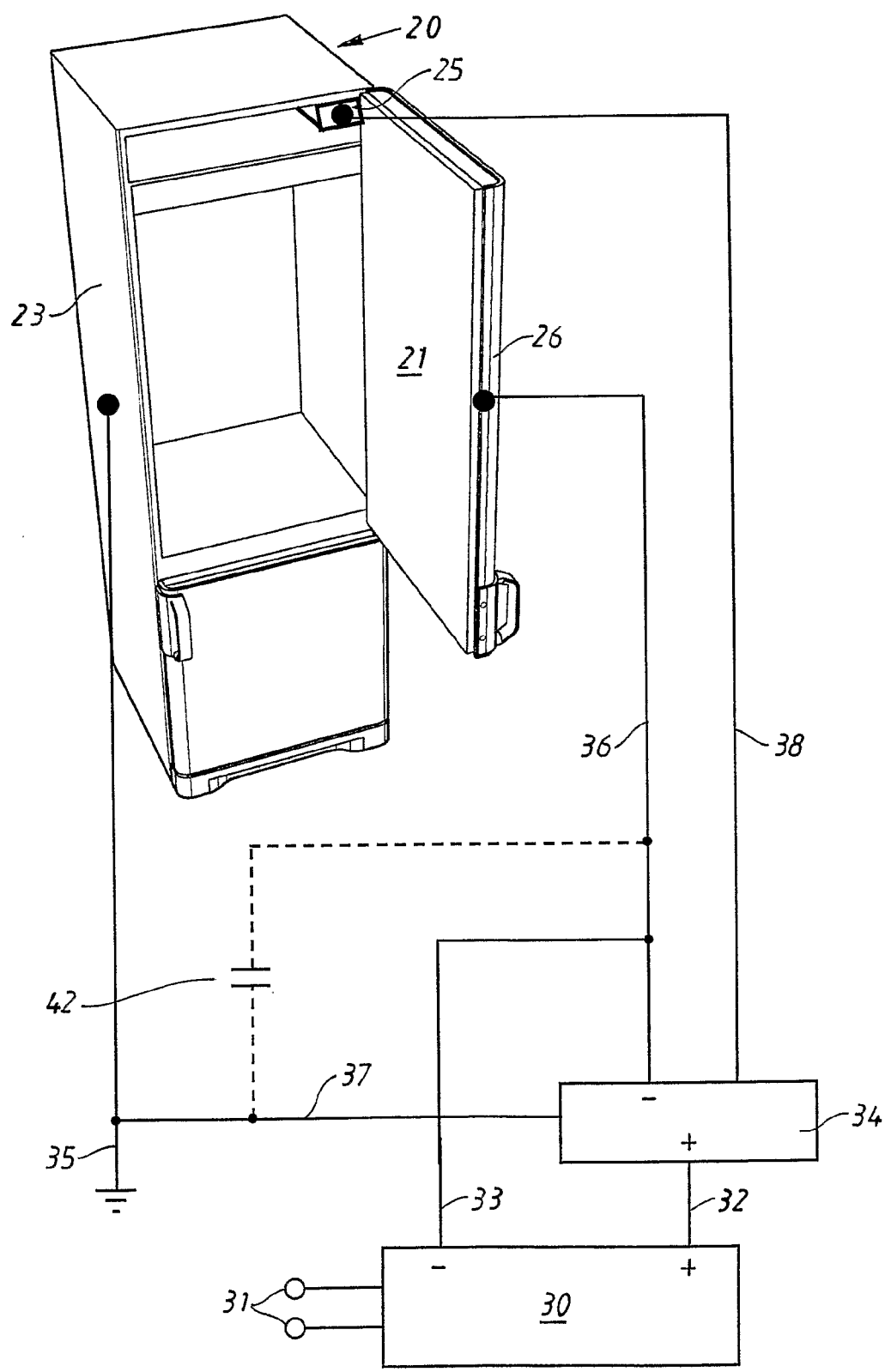
FIG. 4 shows a schematic view of how a capacitive sensor system of the prior art type is connected to the cabinet of FIG. 1.

In FIG. 4 an electrical scheme shows how a capacitive sensing system could be arranged in the cooling cabinet 20. This scheme does not show all components used since it is only intended to illustrate the main scope of arranging a capacitive sensing system in a cooling cabinet. More details are shown in the embodiment shown in FIGS. 5-9, which figures illustrate the main scope of the present invention.

In the figure the cooling cabinet 20 is shown with the upper door 21, the electrically operable unit 25, the upper door outer liner 26 and the cabinet body metal outer liner 23. A power source 30 is provided as part of the capacitive sensor system. The source provides power to the system and preferably also provides power to the electrically operable unit. The power source is connected via connection 31 to electrical power, for instance 230 Volts AC. The power source also has two power outputs, 32 for positive and 33 for negative, providing DC voltage preferably within the range 12-24 Volts. The outputs 32 and 33 are both connected to the capacitive sensor unit 34.

The sensor system receives a signal from the outer liner 23 of the cabinet body through a line 37, which outer liner forms an earth plane of the cabinet. Said earth plane may preferably but not necessarily be connected to an external earth 35. Line 38 illustrates the transmission line for controlling and providing power to the electrically operable unit 25. The sensor system is further connected to the upper door outer liner through line 36, said line also being connected to power output 33.

The main idea with the disclosed capacitive sensing system is to operate the door by the electrically operable unit 25 based on the detection of the properties of a capacitance 42, see FIG. 4, formed between the upper door outer liner 26 and the cabinet body outer liner 23. The operation of the system is based on the fact that the system is able to detect changes in the capacitance caused by the presence of a human body. The door will work as antenna in the sensor system. When the user moves his hand towards the door the system will detect that the capacitance increases from time to time. Correspondingly, the system will also, when the user removes his hand detect that the capacitance decreases from time to time. And finally, if the user holds his hand on the door the capacitance will after it have increased be kept steady from time to time. These three events will be the basics from which the system controls the movement of the door.

The illustrative embodiment of FIGS. 1-4 intends to illustrate the concept on which the illustrative embodiments of FIGS. 5-9 is based upon. Such a concept of implementing a capacitive sensor system on a door is known, while the use of such a system on a refrigerator door is new. Instead of implementing the antenna in the door, in the shape of a strip of conductor, the system uses the metal liner of the door as antenna. By doing that, advantages like lower costs for components and manufacturing is achieved. The most important thing is that the door liner is electrically insulated from the cabinet body.

Figure 5:
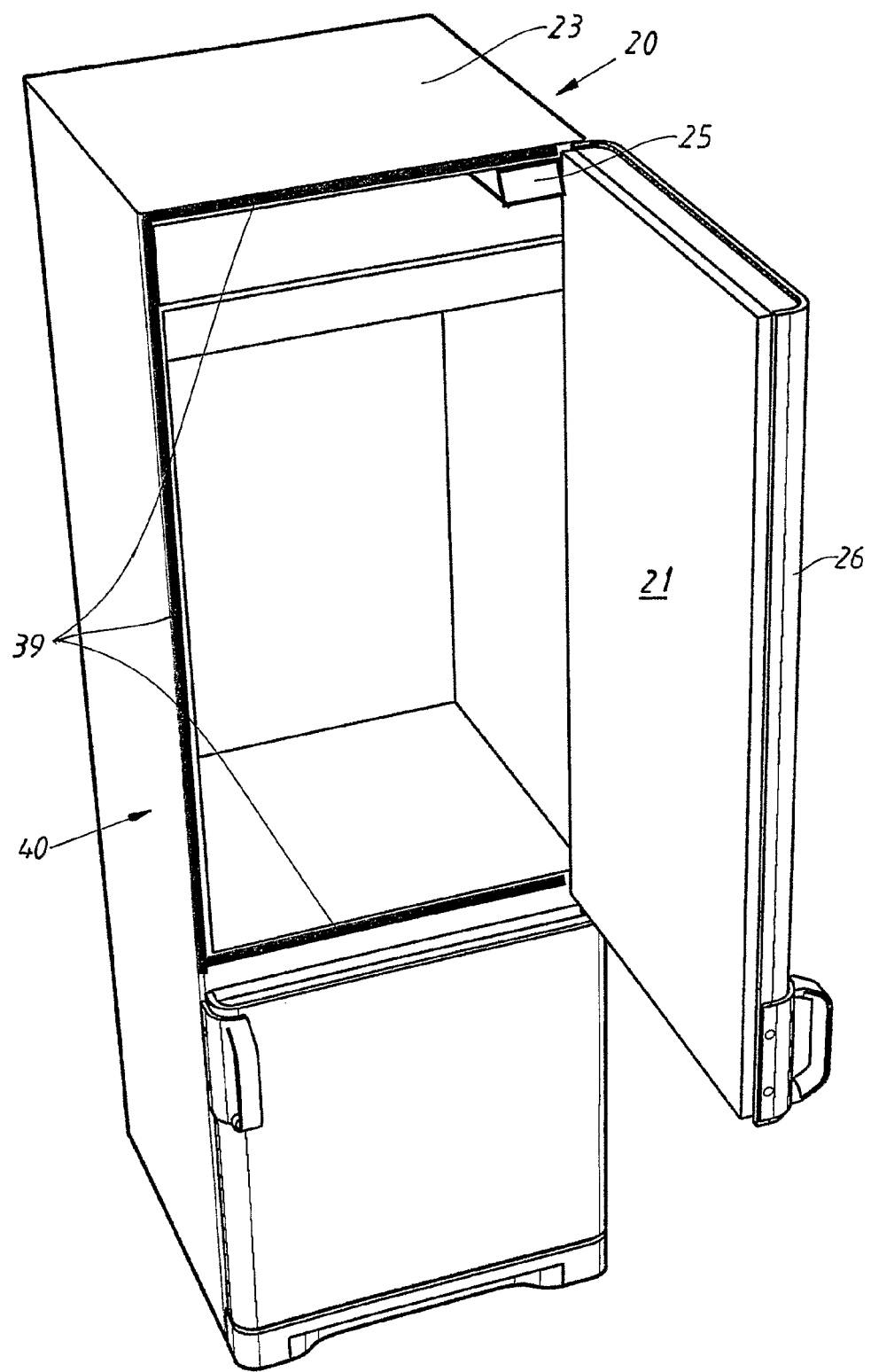
FIG. 5 shows a front perspective view of a cooling cabinet in which the capacitive sensor system of the present invention could be implemented.

The illustrative embodiments showing the scope of the invention will now be described in relation to FIGS. 5-9. In FIG. 5 the cabinet of FIG. 1 is shown with the cooling cabinet 20 and its upper door 21, the electrically operable unit 25 for moving the door, the upper door outer liner 26 and the cabinet body metal outer liner 23. Further details of the cabinet and the upper door are also disclosed in FIGS. 1-4. In FIG. 5 an electrically conductive part 39 is arranged on the periphery 40 of the opening of the upper compartment 24. The part stretches all the way around the four sides of the periphery. The part could for instance be designed as a cabinet gasket or the like. The main important thing is that it is at least semi-conductive. It could of course as an alterative be fully conductive, meaning a metal strip for instance made in copper.

Figure 6:
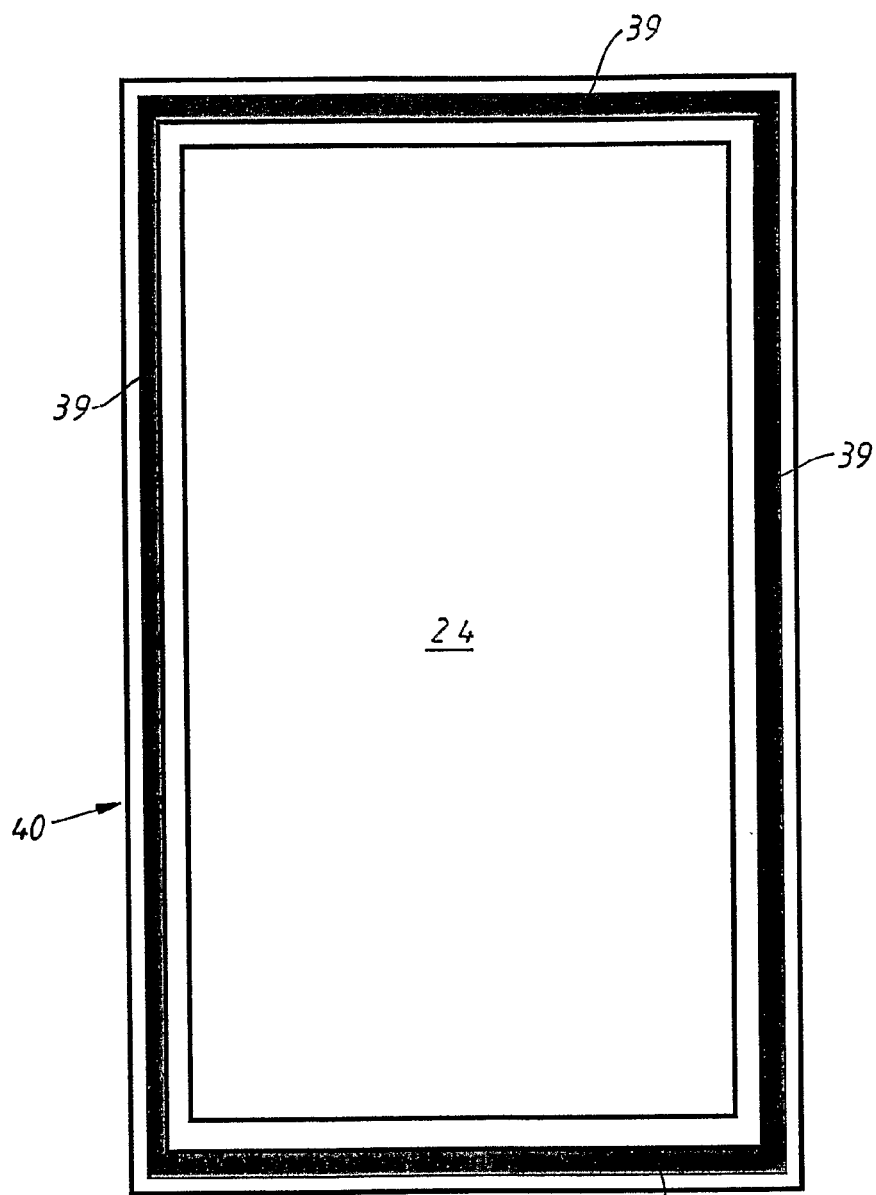
FIG. 6 shows in a front view how a part of the antenna of the capacitive sensor system according to the present invention is arranged on the cabinet body according to FIG. 5.
Figure 7:
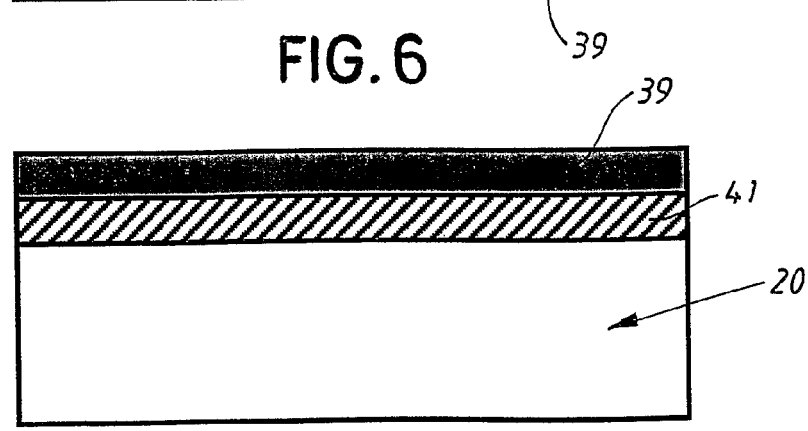
FIG. 7 shows the arrangement of FIG. 6 in a top view.
Figure 8:
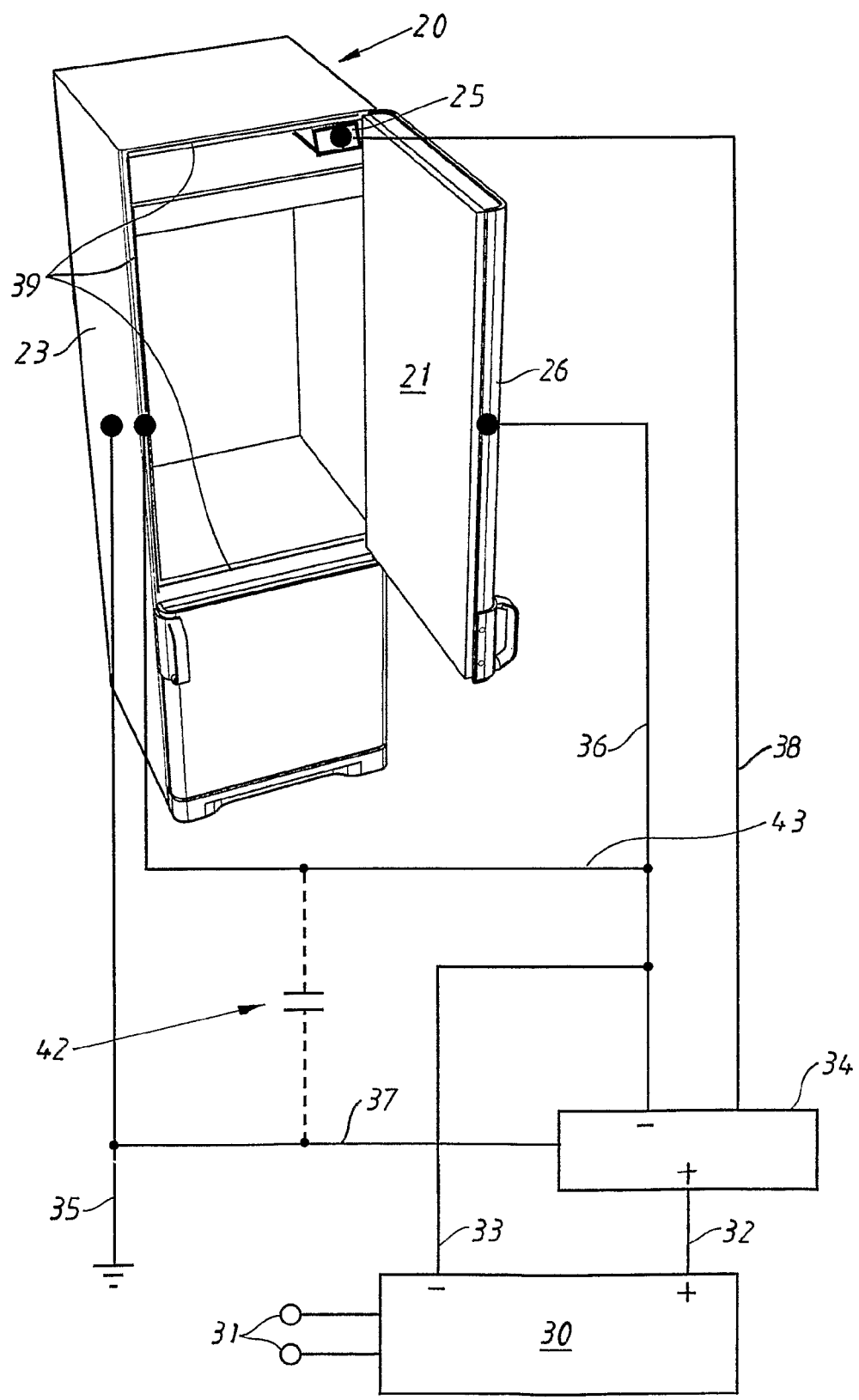
FIG. 8 shows a schematic view of an illustrative embodiment showing how the capacitive sensor system according to the present invention could be connected to the cabinet according to FIG. 5.

In FIG. 6 it is shown (the door 21 have been removed) that the electrically conductive part 39 stretches all the way around the periphery 40 of the opening of the upper compartment 24. In FIG. 8 the cabinet of FIG. 7 is shown as a bottom view. The conductive part and the cabinet 20 on which it is arranged are marked out. In the figure an electrical insulation layer 41 is also shown. This is arranged to enable that the conductive part is not electrically connected to the cabinet body metal outer liner 23 or any other part of the cabinet body. This arrangement is crucial for the operation of the system, which will be shown later on.

FIG. 8 in many aspects corresponds to FIG. 4 despite from the electrically conductive part 39 which is connected to the system. The cooling cabinet 20 is shown with its upper door 21, the electrically operable unit 25 for moving the door, the upper door outer liner 26 and the cabinet body metal outer liner 23 being connected to an earth plane. The capacitive system is also shown with the power source 30 providing DC voltage preferably 12-24 Volts to the capacitive sensor unit 34. The system receives a signal from the outer liner 23 of the cabinet body through a line 37, which outer liner preferably but not necessarily is connected to electrical earth via 35. Line 38 illustrates the transmission line for controlling and providing power to the electrically operable unit 25.

Figure 9:
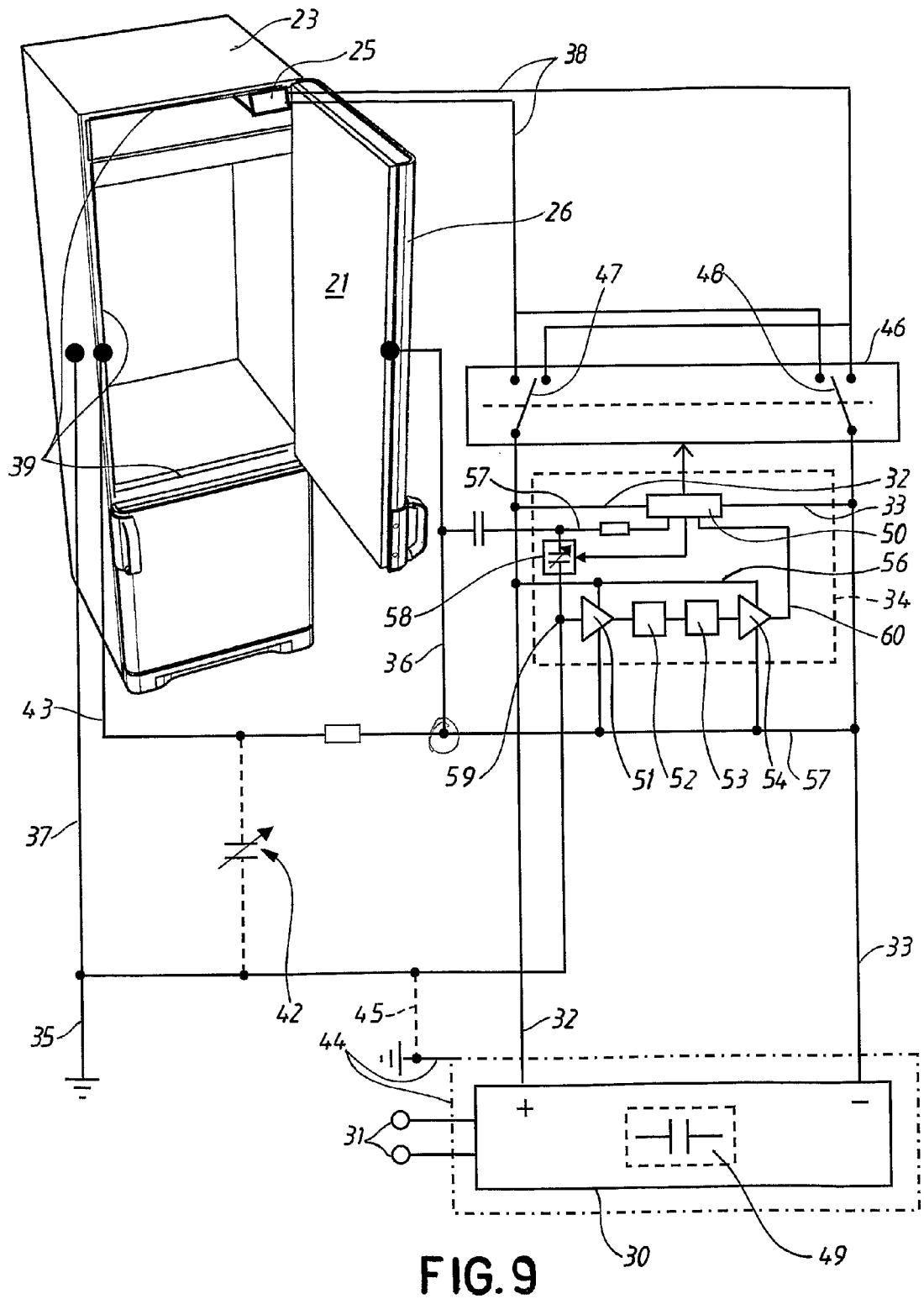
FIG. 9 shows a more detailed schematic view of an illustrative embodiment showing how the illustrative embodiment of FIG. 8 could be designed.

The sensor system is further connected to the upper door outer liner 26 through line 36, said line also being connected to power output 33, the negative pole. Moreover, the electrically conductive part 39 is connected to the upper door outer liner through line 43. The capacitance 42 earlier described is also shown in FIG. 9. The properties of said capacitance is important in relation to the capacitive sensor system. Since the upper door outer liner and the conductive part 39 are connected they are arranged in parallel in relation to the capacitance 42 formed. The connected parts will both operate as antennas in the capacitive sensor system.

An illustrative embodiment of the capacitive sensor system is further illustrated in the electrical diagram of FIG. 9. In this view the power source 30, the capacitive sensor unit 34, the cabinet body outer liner 23, the upper door outer liner 26 and the semi-conductive part 39 are schematically illustrated. The lines from FIG. 9 are also shown, and based on FIG. 10 the function of the arrangement according to FIG. 9 will be described. The power source 30 provides power, preferably 12-24 Volts DC to the capacitive sensor system. In relation to the invention, the parts of the cabinet used as antennas and as motor are considered as parts of the system. The power source is for instance connected to 230 Volts AC through connections 31. The power source could for instance be a switched transformer. The source (see FIG. 9) provides power to line 33 (negative pole) and line 32 (positive pole).

The capacitive control unit 34 receives power from the power source via lines 32 and 33, line 33 also being connected to the door liners 26 and the electrically conductive part 39. Moreover, the unit is connected to the cabinet body outer liner 23. Based on the properties of the capacitance 42, the operation of the system mentioned below, the unit controls a switchable relay device 46 which provides power to the electrically operable unit 25. As shown the relays 47 and 48 can switch in order to change the rotational direction of the operable unit, thereby operating the direction if the movement of the door. The switchable device can of course be replaced with other means for electrically operating the movement of the door.

The sensor unit 34 comprises a micro controller 50. Power is provided from the power unit 30 to the controller through the two transmissions lines 32 and 33. There are also an emitter follower 51 in form an amplifier, a bandpass filter 52, a voltage rectifier 53 and a DC amplifier 54. Power is provided through lines 56 and 57.

The electrically operable unit 25 can as an alterative be provided with power other than from the power source 30. If the intention is to bring down the influence from the power lines of the motor to the system, such a solution may be preferable since you have a better option physically separate the different part of the system when arranging them in the cabinet. However, the solution of FIG. 9 will give a better option to use the motor power transmission lines 32 and 33 as part of the capacitive sensor system. Such a solution is disclosed in the PCT document WO02/089328.

When a person approaches the cabinet door the proximity of this person increases the capacitance 42 between the cabinet and the door (normally closed). This is sensed by the capacitive sensor into which a reference signal that has a repetition frequency of 8 kHz is fed. This signal is fed through line 57 and also through a variable capacitance 58. The two capacitances form a voltage divider with an output AC voltage at 59. The emitter follower 51 reduces the risk of interference, the bandpass filter 52 removes disturbing frequency noise while the voltage rectifier 53 rectifies the signal. The signal is finally amplified 54 to improve the capability of detecting changes. The connection line 60 feed the signal to an A/D input on the micro controller.

If a resulting reduction (caused by the proximity of a person) of the DC output voltage at 60 from the latter has an amplitude below a chosen sensitivity threshold or a duration of less than 1 second or more than 3 seconds, then no action is to be taken. This means that a person can pass by or rest the body against the door or write a note on the same. Provided that a sufficient reduction of the DC output voltage has had duration from 1 to 3 seconds, the micro controller via the switchable unit 46 activates the electrically operable unit 25 so as to open the door. For instance if a motor is used, a sufficient subsequent reduction of the DC output voltage stops during its duration the motor and reverses thereafter its motion so that the door is closed. If there is no such subsequent reduction of the DC voltage, the micro controller will nevertheless close the door after a chosen time limit, for example 30 seconds.

According to the invention, the metallic outer liner 26 of the door is electrically insulated from the cabinet and connected to the mentioned capacitive sensor system. It is also provided with a connection to the electrically conductive part 39 arranged in the door opening of the cabinet and electrically insulated from the latter. A jam sensor is thereby obtained by the combination of the mentioned metallic means. Another advantageous combination effect is that there is a reduced variation of the capacitance between the cabinet and the door when the latter is opened and closed. This facilitates the design of the capacitive sensor.

It is crucial to keep track of the capacitance 49 formed in the power source since the system operates by sensing the properties of the capacitance 42. For instance a capacitance could be formed between the coil cooling the rectifier and the rectifier itself. Moreover, a capacitance values could be formed in the transformer. The capacitance 49 will in such cases be arranged between the powered component and the parts of the power source connected to the earth plane of said source. The power source is normally arranged in the cabinet body and in many cases corresponds to the source that provides power to the control system of the cabinet. Therefore, the earth plane 35 of the cabinet 20 will in many cases be jointly connected with the earth plane 44 of the power source 30, as illustrated by connection line 45. Both capacitances 42 and 49 will in that case be connected to the outer liner 23 of the cabinet, either through an earth line or through internal lines. This means that the capacitances 35 and 44 are arranged in parallel and both influence the total capacitance value. As mentioned earlier the cabinet earth plane 35, and correspondingly earth plane 44 is preferably but not necessarily connected to an external earth.

Using the scope of this idea all components of the present sensing system will be able to operate as part of the antenna. Moreover, the electrically operable unit 25 can also operate as part of the antenna. This solution is advantageous especially if the sensing system (the power source excluded) and/or the motor unit is arranged in the door. Instead of interfering with the door antenna 26 and create a "blind" spot on a part of the door, they will be part of the antenna. The disclosed prior art solution will not be described any further in relation to the present invention, however it is obvious for a person skilled in the art how to use implement this solution into the present invention.

It is obvious for the person skilled in the art that the invention is not restricted to a capacitive sensor system adapted only for a cooling cabinet. Instead it can be used in any appliance having a moving part in which an antenna device for a capacitive sensing system is implemented.

The invention claimed is:

1. Capacitive sensor system provided for a door (21) of a refrigeration appliance, the capacitive sensor system being arranged for detecting properties of a capacitance (42) between an antenna device and an earth plane (23), wherein the antenna device comprises a first (26) and a second portion (39) which are movable in relation to each other, the second portion (39) being connected to and electrically parallel with the first portion (26), and the two portions being arranged in parallel in relation to said capacitance (42) for capacitive influence from a small portion of a human body, wherein the first portion (26) being an electrical conductive door part of said door (21), the electrical conductive door part being a liner forming said door, and the second portion (39) being an electrical conductive device arranged at a rest position for the door (21), wherein said door is arranged to close at least one compartment opening of the appliance.

2. Capacitive sensor system according to claim 1 wherein the door (21) is provided with an electrically operable unit (25), whereby the sensor system is provided with a operating device (46) arranged to operate the operable unit (25) and said electrical conductive device (39) being positioned at the periphery of the compartment opening.

3. Capacitive sensor system according to claim 2 wherein said electrically operable unit (25) being arranged to move the door (21), the operable unit (25) being operated depending on the influence of the small portion of a human body through a capacitance formed between the antenna device and said earth plane (23) for said antenna device, the antenna device being electrically insulated from the earth plane.

4. Capacitive sensor system according to claim 3 wherein said capacitive sensor system is integrated into the door (21) and has a signal input (59) connected to said earth plane (23) and a signal ground (36) connected to the electrically conductive door part (26), whereby all components connected to the sensor system will be a part of said antenna device.

5. Capacitive sensor system provided for a door (21), the capacitive sensor system being arranged for detecting properties of a capacitance (42) between an antenna device and an earth plane (23), wherein the antenna device comprises a first (26) and a second portion (39) which are movable in relation to each other, the second portion (39) being connected to and electrically parallel with the first portion (26), and the two portions being arranged in parallel in relation to said capacitance (42) for capacitive influence from a small portion of a human body, wherein the first portion (26) being an electrical conductive door part of said door (21) and the second portion (39) being an electrical conductive device arranged at a rest position for the door (21), wherein the door (21) is provided with an electrically operable unit (25) and in said rest position is arranged to close a passage, whereby the sensor system is provided with a operating device (46) arranged to operate the operable unit (25) and said electrical conductive device (39) being positioned at the periphery of the passage, wherein said electrically operable unit (25) being arranged to move the door (21), the operable unit (25) being operated depending on the influence of the small portion of a human body through a capacitance formed between the antenna device and said earth plane (23) for said antenna device, the antenna device being electrically insulated from the earth plane, wherein said capacitive sensor system is integrated into the door (21) and has a signal input (59) connected to said earth plane (23) and a signal ground (36) connected to the electrically conductive door part (26), whereby all components connected to the sensor system will be a part of said antenna device, and wherein said electrically operable unit (25) is integrated into the door (21) and is arranged to be a part of the electrical conductive door part (26), whereby the operable unit (25) will be an operational part of said first antenna.

\* \* \* \* \*